United States Patent [19]

Abe

[11] Patent Number: 5,116,657
[45] Date of Patent: May 26, 1992

[54] CONDUCTING MATERIAL AND A METHOD OF FABRICATING THEREOF

[75] Inventor: Kenichiro Abe, Tokyo, Japan

[73] Assignee: Fujitsu Limited, Kanagawa, Japan

[21] Appl. No.: 444,423

[22] Filed: Dec. 1, 1989

[30] Foreign Application Priority Data

Dec. 1, 1988 [JP] Japan .................. 63-306582

[51] Int. Cl.$^5$ .................................. B32B 9/00
[52] U.S. Cl. ........................... 428/137; 428/209;
428/426; 428/433; 428/901
[58] Field of Search ............. 428/901, 137, 209, 426, 428/433

[56] References Cited

U.S. PATENT DOCUMENTS 4,868,034 9/1989 Steinberg ........................ 428/901

*Primary Examiner*—Patrick J. Ryan
*Assistant Examiner*—Elizabeth Evans
*Attorney, Agent, or Firm*—Staas & Halsey

[57] ABSTRACT

Vias each having no pore are formed in a multilayer ceramic substrate by filling through holes of green sheets with conducting material obtained by: kneading mixed powder particles, the powder particles produced by adding copper oxide powder particles in the amount of 50% (in weight) or less to copper powder particles, with a solution including methyl ethyl ketone and 0.5% (in weight) of isosulfonyltridecylbenzene titanate; drying and cracking the kneaded mixed powder particles, producing cracked mixed powder particles; classifying the cracked mixed powder particles with a 100 mesh filter, producing classified mixed powder particles; spheroidizing the classified mixed powder particles with a collision method performed in gases flowing at high speed; and firing the green sheets at a temperature of about 800° C.

5 Claims, 9 Drawing Sheets

CONDUCTING MATERIAL AND A METHOD OF FABRICATING THEREOF

BACKGROUND OF THE INVENTION (1) Field of the Invention

The present invention relates to a conducting material to form a via of a green sheet.

As a printed wiring substrate widely used for electronic devices, a multilayer ceramic substrate structured by stacking green sheets has been used with improvement in packing density of semiconductor elements.

Such a multilayer ceramic substrate is generally formed by stacking green sheets having through holes filled with conducting material and then firing such green sheets. In this case, patterns formed between stacked sheets are electrically connected through the vias formed in the through holes. As a conducting material forming vias, copper has been used in order to make small an electrical resistance.

(2) Description of the Prior Art

The conventional via forming method will be explained with reference to FIGS. 1 to 2. FIG. 1(a) is a schematic sectional view for explaining the via forming method. A green sheet 11 is provided with a plurality of through holes 12 at the predetermined positions. A mask 14 is stacked on this green sheet 11 and the surface of mask 14 is the coated with copper paste 17 by the squeegee 15. In this process, the through holes 12 are filled with copper paste 17.

Meanwhile, the copper paste 17 is fabricated by the process shown in FIG. 1(b). First, the copper powder 1 in the grain size of about 1 μm and a solvent 16 such as MEK (Methyl Ethyl Ketone) are mixed and kneaded in the mixing process F by a mixer.

A method for fabricating a ceramics circuit substrate using such copper paste has been disclosed, for example, in the Japanese laid-open patent application 63-271995 (laid-open date; Sept. 28, 1988) by H. Yokoyama, M. Tsukada and H. Suzuki.

As shown in FIG. 2(a), the copper paste filling the through holes is in such a condition as allowing clearance between particles 1A of copper powder 1. When the green sheet is fired at the temperature of about 800° C., the copper paste is sintered and particles 1A bind with each other as shown in FIG. 2(b). As a result, the copper paste filling the through holes 12 forms vias 13 as shown in FIG. 2(c). FIG. 2(c) schematically shows the section of vias in parallel to the green sheet surface.

In the case of forming the vias 13 by sintering of the copper paste many organic materials are included and therefore such organic materials are vaporized during the sintering process. If such vaporization is generated at the latter process of firing for the green sheet, pores 13A are formed, as shown in FIG. 2(c), at the boundary of internal surface of through hole 12 and via 13 and within the via 13, and binding between the particles becomes non-dense, resulting in a problem that electrical resistance of via 13 becomes high.

Moreover, another problem described hereafter will also be generated.

FIG. 2(d) is a schematic sectional view of a multilayer ceramic substrate 18 fabricated by sintering a plurality of stacked green sheets 11.

When expansion of vapor of organic materials during the firing process occurs, a mound G1 of a pattern 10 formed on the surface of green sheet 11 is generated at the position of via 13 and peeling G2 of a pattern is also generated. As a result, the vias 13 are no longer connected to the pattern 10 accurately.

SUMMARY OF THE INVENTION

It is an object of the present invention to form low resistance vias.

It is another object of the present invention to form vias correctly connected with patterns.

These objects are achieved by using a conducting material which is obtained by kneading a mixed powder including a predetermined amount of copper oxide powder, to copper powder, and a solvent including an organic titanium compound, cracking (breaking-up) solidified particles coated by film of organic titanium compound to respective particles of copper powder and copper oxide powder after drying up such mixed powder and then executing the spheroidizing process by the collision method by high speed gases flow after classifying such cracked (broken-up) particles in accordance with grain sizes.

Namely, the copper oxide powder added in the predetermined amount to copper powder is reduced in the sintering process and active oxygen is generated at this time. Vaporization of organic materials is accelerated by the effect of such active oxygen and thereby vaporization is carried out at the temperature lower than that in such a case that copper oxide powder is not included. Accordingly, generation of pores at the area between internal surfaces of through holes and vias and within the vias can be suppressed.

Moreover, since respective particles of copper powder and copper oxide powder are coated with an organic titanium compound film, adhesion of respective particles to the internal surface of the through hole can be increased.

In addition, packing density for the through hole of the mixed powder of copper powder and copper oxide powder can also be increased by conducting the spheroidizing to respective particles of copper powder and copper oxide powder.

As a result, the vias have lower electrical resistance and ensure accurate connection with the pattern. The vias can be fabricated by filling the through holes of green sheet with the conducting material and employing the via fabrication method of the present invention.

DESCRIPTION OF THE PREFERRED EMBODIMENTS

Figure 1A:
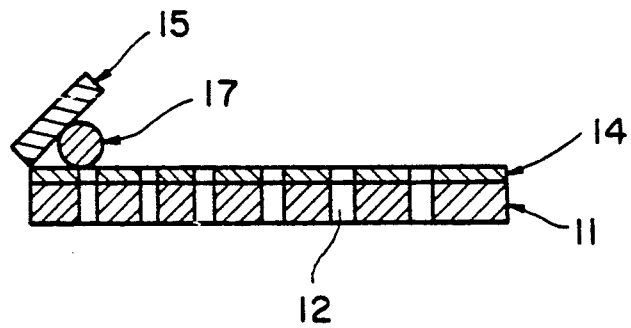
FIG. 1(a) is a schematic sectional view indicating a method of copper paste coating in the fabrication of vias.
Figure 1B:
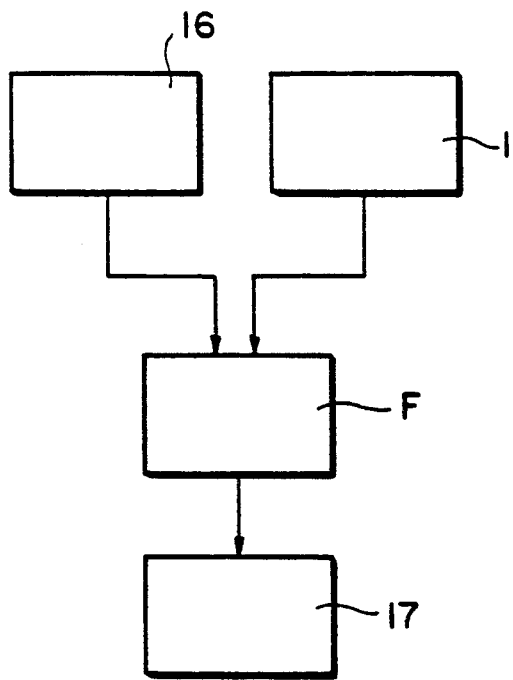
FIG. 1(b) is a block diagram indicating the process of conventional copper paste fabrication.
Figure 2A:
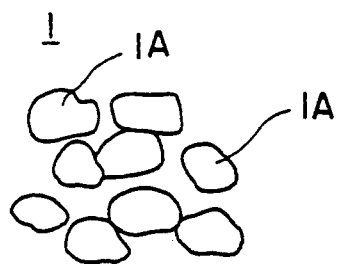
FIG. 2(a) is a schematic diagram indicating the condition of copper particles of conventional copper paste.
Figure 2B:
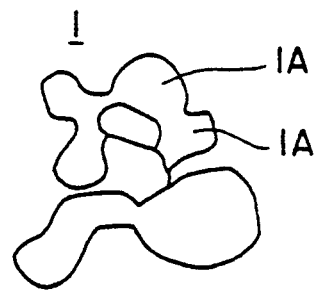
FIG. 2(b) is a schematic diagram indicating the condition of copper particles in the case that the copper paste of FIG. 2(a) is sintered at 800° C.
Figure 2C:
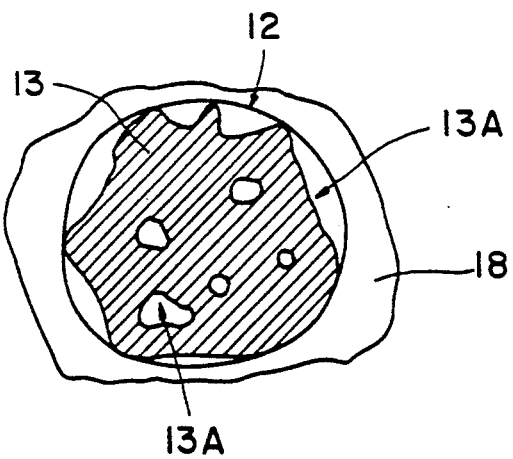
FIG. 2(c) is a schematic sectional view, parallel to the conventional green sheet, of vias.
Figure 2D:
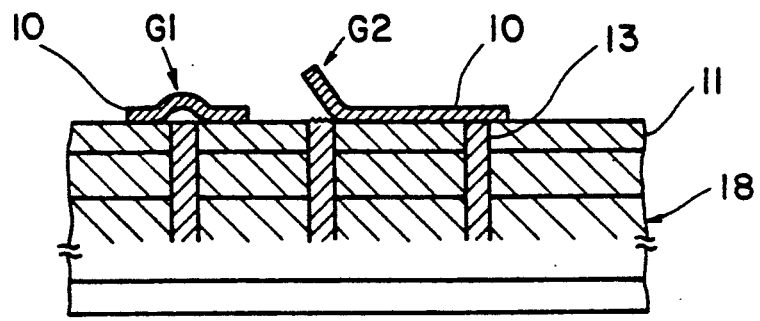
FIG. 2(d) is a schematic sectional view including vias of a conventional multilayer ceramic substrate.

The preferred embodiments of the present invention will be explained with reference to FIGS. 3 to 6.

The like elements are designated by like reference numerals throughout the drawings. FIG. 3(b) is a block diagram indicating a conducting material fabrication process of the present invention and FIG. 4 is a diagram indicating the conditions of powder particles in each process.

Figure 4A:
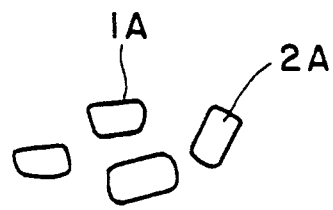
FIG. 4(a) is a schematic diagram of copper and copper oxide particles in the mixed powder of copper and copper oxide powder.

First, the copper oxide powder 2 of 1 to 20% is mixed with the copper powder 1 in the grain size of about 1 μm. This condition is indicated in FIG. 4(a) as the copper powder particles 1A and copper oxide powder particles 2A.

Meanwhile, as shown in FIG. 3(b), a solvent 3 is obtained by dissolving an organic titanium compound 3B (for example, isosulfonyltridecylbenzen titanate) of 0.5% in weight with MEK 3A. Solvent 3 is for the mixed powder of copper powder 1 and copper oxide powder 2.

Next, these copper powder 1 and copper oxide powder 2 are mixed with the solvent 3 for about 30 minutes in the mixing process A. After mixing by the mixing process A, MEK 3A included in the solvent 3 is vaporized and dried in the drying process B of FIG. 3(b). Thereby, the surfaces of copper powder particles 1A and copper oxide powder particles 2A are coated with the organic titanium compound film 4 as shown in FIG. 4(b).

Figure 5A:
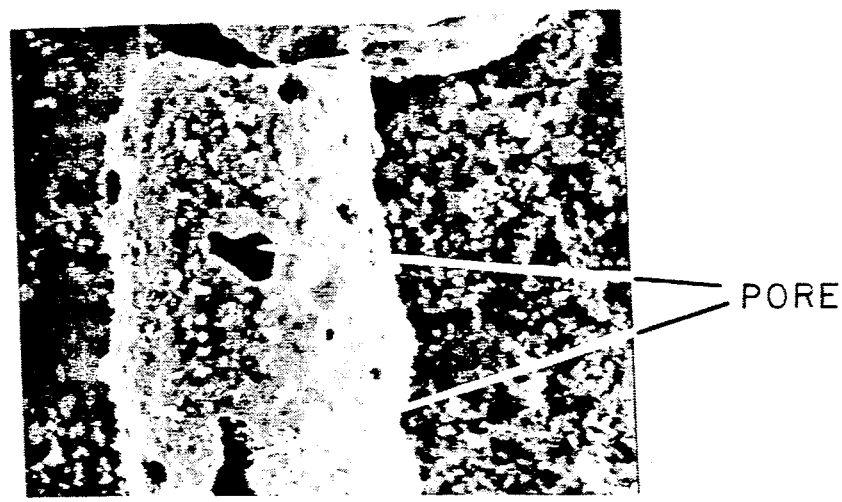
FIG. 5(a) is a photograph by SEM of a part of a column surface of a via in such a case that a conducting material is used that does not have added copper oxide powder.
Figure 5B:
FIG. 5(b) is a photograph by SEM in such a case that 1% of copper oxide powder is added to copper powder.
Figure 5C:
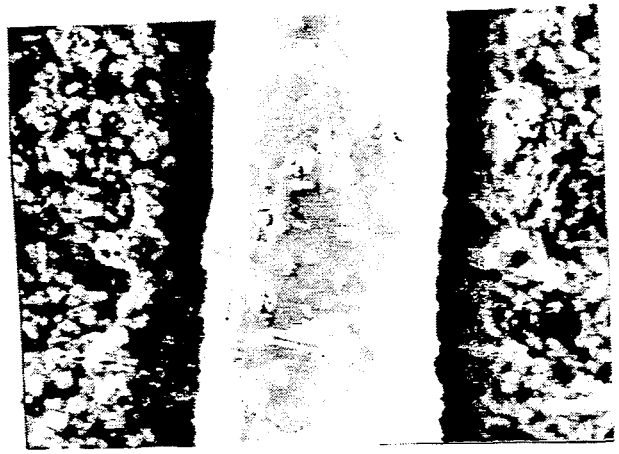
FIG. 5(c) is a photograph by SEM in such a case that 5% of copper oxide powder is added to copper powder.
Figure 5D:
FIG. 5(d) is a photograph by SEM in such a case that 10% of copper oxide powder is added to copper powder.
Figure 5E:
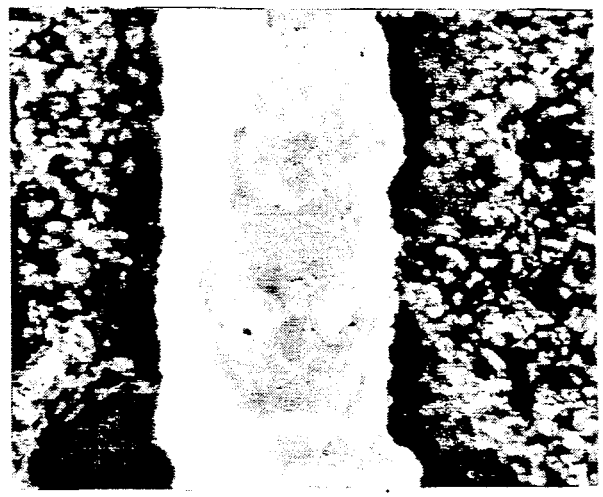
FIG. 5(e) is a photograph by SEM in such a case that 25% of copper oxide powder is added to copper powder.

Thereafter, the mixed powder solidified by the drying process B is cracked (the solidified mixed powder is broken-up) of FIG. 5(c) to 5(e) is also the via and is classified through a filter of about 100 mesh in the classifying process C of FIG. 3(b). As a result, the grain size of copper powder particles 1A and copper oxide powder particles 2A is kept at the value less than the predetermined value. As described above, the mixed powder in the grain size less than the predetermined value is spheroidized in the spheroidizing process D of FIG. 3(b) by the collision method of high speed gases flow, for example, using the hybridization system (Nara Machinery Works, Co.). The collision method of high speed gases flow is described in detail, for example, in the "Fine Particle Design" p. 157, by Masazumi Koishi, published by Industrial Survey Inst.

Figure 4B:
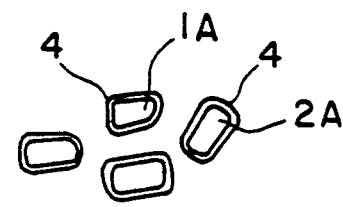
FIG. 4(b) is a schematic diagram indicating the condition of copper powder particles and copper oxide powder particles coated with organic titanium compound film.
Figure 4C:
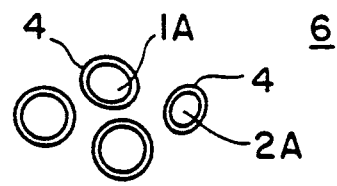
FIG. 4(c) is a schematic diagram indicating the condition of spherical copper and copper oxide particles coated with organic titanium compound film and having a grain size less than a predetermined value.

As a result, the conducting material 6 of mixed powder consisting of spheroidized powder particles coated with organic titanium compound film having the grain size less than the predetermined value can be formed, as shown in FIG. 4(c).

Figure 3A:
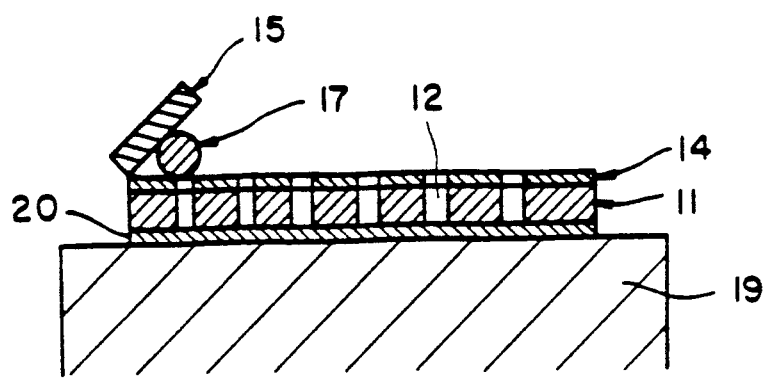
FIG. 3(a) is a schematic sectional view indicating a method of loading the mixed powder into through holes of a green sheet in the present invention.
Figure 3B:
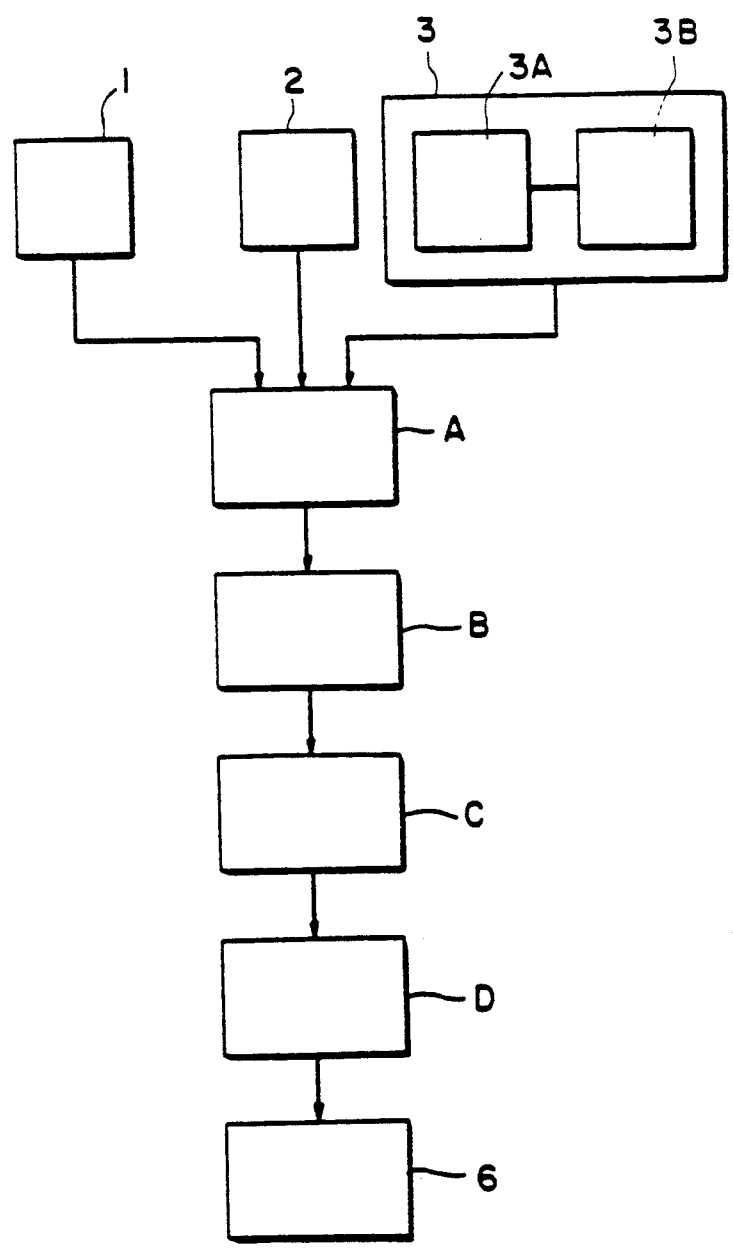
FIG. 3(b) is a block diagram showing a conducting material fabrication process of the present invention.
Figure 4D:
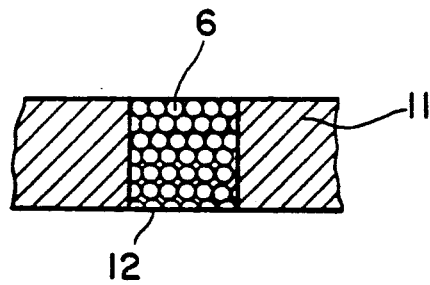
FIG. 4(d) is a schematic diagram indicating the condition wherein the through holes of the green sheet are filled with the conducting material fabricated by the process of FIG. 3(b)

The conducting material 6 fabricated by the processes of FIG. 3(b) is used to fill the though holes 12 of green sheet 11 as shown in FIG. 4(d) using a mask 14 of FIG. 3(a) like the prior art. However, in the present invention, since the particles 1A and 2A are spheroidized, the packing density of through hole is sufficiently large.

Figure 4E:
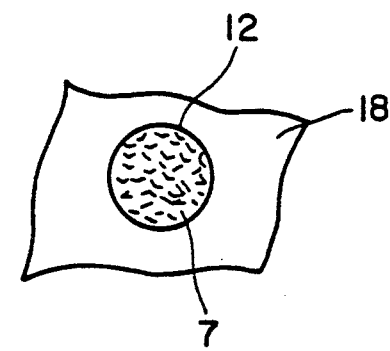
FIG. 4(e) is a schematic diagram indicating the condition wherein the via is formed by sintering the conducting material filling the through holes of a multilayer ceramic substrate.

Further, in order to obtain better filling for all through holes of a green sheet 11, a porous tetrafluoroethylen resin sheet 20 is interposed between the green sheet 11 and a suction table 19, which places the green sheet 11 under a drawing suction as shown in FIG. 3(a). (A suction pump is not depicted.) By interposing the porous tetrafluoroethylen resin sheet 20, sucking force becomes uniform over all through holes of the green sheet 11. As the result, loading the conducting material 6 into the all through holes can be performed uniformly. As described above, a multilayer ceramic substrate 18, in which the vias 13 are formed by sintering the conducting material 6 filling the through holes 12 as shown in FIG. 4(e), may be fabricated by firing the green sheet 11 in which the through holes thereof are filled the conducting material 6.

The firing of the green sheet is generally carried out at the temperature of about 800° C. In this case, organic materials included in the conventional conducting material (copper paste) start to be decomposed at about 400° C. Some of them are vaporized and the others remain. Those remaining as carbon are vaporized at 600° to 800° C. However, when the copper oxide powder 2 is mixed into the conducting material as in the case of the present invention, decomposition of residual carbon is accelerated and is vaporized at 600° C. as oxides. Therefore, carbon, which is vaporized by the firing at 800° C., does not remain.

The organic titanate compound film coating the copper powder particles 1A and copper oxide powder particles 2A changes to titanium oxide ($TiO_2$) in the firing process of the green sheet at 800° C. As a result, the conducting material 6 of the present invention is used for filling the through holes 12 of green sheet 11 and is sintered. In this case, the titanium oxide easily binds with alumina included in the green sheet 11 and thereby the vias 7 are adhered to the internal surface of through hole 12.

As explained above, in the present invention, the packing density of particles 1A and 2A in via 7 is large, pores are not generated at the interface between the interior of via 7 and the internal surface of through hole 12 and thereby electrical resistance of via can be minimized.

In the embodiment explained above, the weight ratio of copper oxide powder 2 in the copper powder 1 is selected to be about 1 to 20% and it has been proved by experiments of the inventor that such range of weight ratio is the best range of weight ratio.

The vias have been fabricated in the mixed powder of five kinds, i.e., in the amount of 1%, 5%, 10%, 25% and 50% copper oxide powder 2 relative to copper powder 1, and the respective metallic structures have also been compared using a scanning electron microscope (SEM).

FIGS. 5(a) to 5(f) show photographs by SEM of a part of cylindrical surface of an exposed via in which the ceramic at the side surface of a multilayer ceramic substrate 18 selectively etched so that the via is exposed. The magnification factor of these photographs is set to 1000.

FIG. 5(a) is an example of a conventional via in which copper oxide powder is not added.

A white pole shown vertically extending through the central area of FIG. 5(a) is the via.

Many pores, as indicated by the arrow marks, can be observed in this pole.

FIG. 5(b) is a photograph by SEM of a via in which copper oxide powder in the amount of 1% is added to copper powder. The while pole shown vertically extending through the central area of FIG. 5(b) is the via. Some black pores exist in the via but the number of such pores is very small.

FIG. 5(c), FIG. 5(d) and FIG. 5(e) respectively show the photographs by SEM taken in the case that the copper oxide powder in the amount of 5%, 10% and 25% is added, respectively. The white pole respectively shown vertically extending through the central area as in the case of FIG. 5(a) and FIG. 5(b). Few black pores exist in the vias shown in FIGS. 5(c), 5(d) and 5(e).

Figure 5F:
FIG. 5(f) is a photograph by SEM in such a case that 50% of copper oxide powder is added to copper powder.

FIG. 5(f) shows a photograph in which the copper oxide powder in the amount of 50% is added. In this case, black pores do not exist in the via as in the case of FIG. 5(c), FIG. 5(d) and FIG. 5(e). However, in this case, a mixing rate of copper oxide to copper is large and therefore reduction of copper oxide does not proceed sufficiently and it remains as it is. Accordingly, sintering of the mixed powder of copper powder and copper oxide powder is interfered with and the shape of the sintered copper becomes irregular, resulting in easy disconnection of copper. In FIG. 5(f), a part of a copper grain having an anomalously large grain size is shown. Therefore, it is desirable that amount of copper oxide powder to be added is selected to 50% or less.

Next, the effect of the spheroidizing process on the mixed powder of copper powder 1 and copper oxide powder 2 in the present invention will be explained with reference to FIGS. 6(a) to 6(d).

Figure 6A:
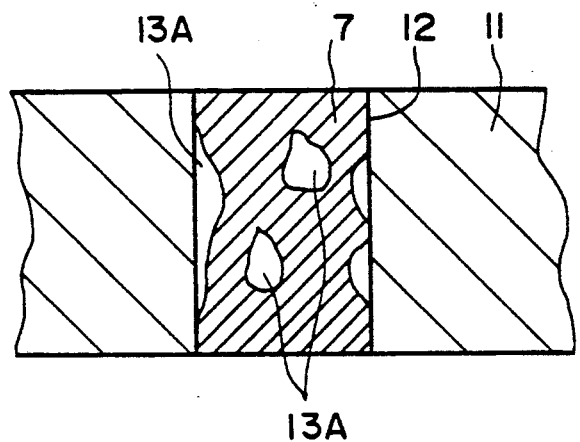
FIG. 6(a) is a schematic sectional view indicating the condition of mixed powder filling the through holes before the firing, wherein the mixed powder has been formed by the conducting material fabrication process of the present invention shown in FIG. 3(b), but in which only the spheroidizing process is omitted.

FIG. 6(a) is a schematic sectional diagram indicating the condition of the mixed powder used to fill the through hole 12 before the firing, wherein the mixed powder is fabricated by the conducting material fabrication process of the present invention shown in FIG. 3(b), but in which only the spheroidizing process is omitted therefrom. It is shown that some pores 13A exist in the mixed powder filling the through holes 12 and the area between the mixed powder and internal walls of through hole 12.

Figure 6B:
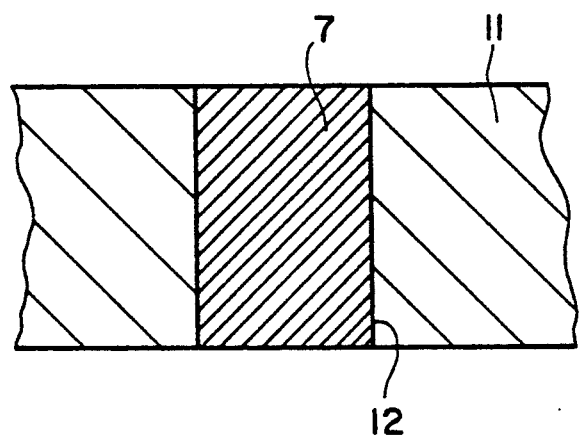
FIG. 6(b) is a schematic sectional view indicating the condition of mixed powder filling the through holes before the firing, wherein the mixed powder has been formed by the conducting material fabrication process of the present invention shown in FIG. 3(b)

FIG. 6(b) is a schematic sectional diagram indicating the condition of the mixed powder used to fill the through hole 12 before the firing, wherein the mixed powder is fabricated by the conducting material fabrication process of the present invention shown in FIG. 3(b). As shown in FIG. 6(b), in case that the through hole 12 is filled with the conducting material fabricated by the present invention, the mixed powder is almost uniformly packed without generation of pores, unlike FIG. 6(a), because each particle of the mixed powder is spheroidized.

Figure 6C:
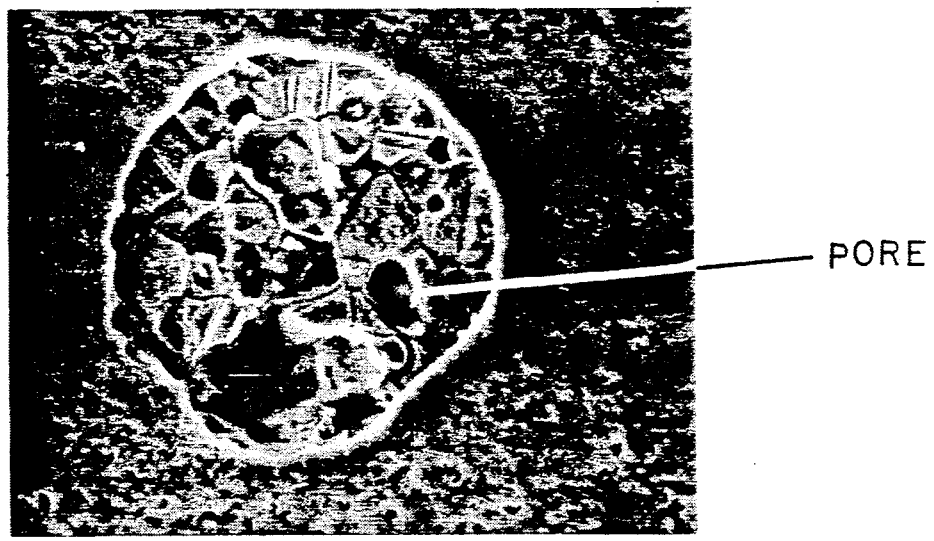
FIG. 6(c) is a photograph, by SEM having the section parallel to the green sheet surface, of via fabricated corresponding to FIG. 6(a)
Figure 6D:
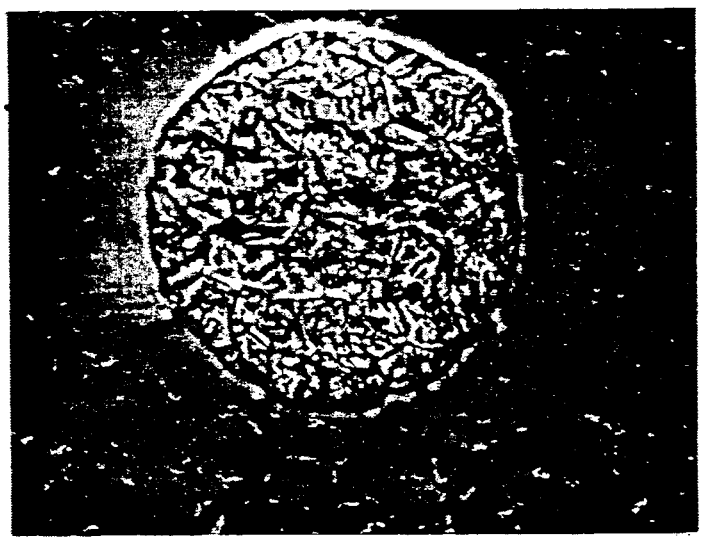
FIG. 6(d) is a photograph, by SEM having the section parallel to the green sheet surface, of via fabricated corresponding to FIG. 6(b).

FIG. 6(c) and FIG. 6(d) respectively show photographs, by SEM having the section in parallel to the green sheet surface, of the vias respectively formed by firing those shown in FIGS. 6(a) and 6(b). Copper is selectively etched so that the conditions of the via formed in the through hole becomes apparent. The magnification factor of respective photographs is set to 1000.

FIG. 6(c) is a photograph by SEM of a via formed without the spheroidizing process, corresponding FIG. 6(a). The packing density in the circular through hole is bad and pores, as indicated by the arrow mark, are generated between the internal wall surface of the through hole and the via.

FIG. 6(d) is a photograph by SEM of a via corresponding to FIG. 6(b). In this case, packing density in the circular through hole is good and pores are not generated between the internal wall surface of the through hole and the via and in the via itself.

For fabrication of the via shown in FIGS. 6(a) and 6(b), a material having the following compositional amounts is used copper powder in the amount of 90 g, copper oxide powder in the amount of 10 g, organic titanium compound in the amount of 0.5 g and MEK in the amount of 200 ml.

What is claimed is:

1. A green sheet including a conducting material with which through holes of the green sheet are filled and vias in the through holes are formed respectively in a process for firing the green sheet, said conducting material comprising:
spheroidized copper powder particles, each surface of said spheroidized copper powder particles being coated with an organic titanium compound film; and
spheroidized copper oxide powder particles, each surface of said spheroidized copper oxide powder particles being coated with an organic titanium compound film; wherein
said spheroidized copper oxide powder particles and said spheriodized copper powder particles are mixed to form mixed powder particles so that the weight of said spheroidized copper oxide powder particles is less than 50% of the weight of said spheroidized copper powder particles.

2. A conducting material according to claim 1, wherein said organic titanium compound is isosulfonyl-tridecylbenzene titanate.

3. A green sheet including a conducting material with which a via in the green sheet is filled, said conducting material comprising:

a mixed powder including spheroidized copper powder particles and spheroidized copper oxide powder particles, each surface of said spheroidized copper powder particles and said spheroidized copper oxide powder particles being coated with a film including an organic titanium compound, wherein the weight of said spheroidized copper oxide particles in said mixed powder is less than 50% of the weight of said spheroidized copper powder particles.

4. A conducting material according to claim 3, wherein the weight of said spheroidized copper oxide powder particles is between 1% and 20% of the weight of said spheroidized copper powder particles.

5. A conducting material according to claim 3, wherein said organic titanium compound is isosulfonyl-tridecylbenzene titanate.

* * * * *